United States Patent
Wang et al.

(10) Patent No.: US 12,332,325 B2
(45) Date of Patent: Jun. 17, 2025

(54) METHOD AND ELECTRONIC DEVICE FOR DETERMINING ROAD TYPE

(71) Applicant: National Yang Ming Chiao Tung University, Hsinchu (TW)

(72) Inventors: Chia-Cheng Wang, New Taipei (TW); Jyh-Cheng Chen, Hsinchu (TW); Yu-Xin Xiao, Hsinchu County (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 244 days.

(21) Appl. No.: 18/058,384

(22) Filed: Nov. 23, 2022

(65) Prior Publication Data

US 2024/0118352 A1 Apr. 11, 2024

(30) Foreign Application Priority Data

Oct. 7, 2022 (TW) .................................. 111138294

(51) Int. Cl.
  *G01R 33/00* (2006.01)
  *B60W 40/06* (2012.01)
(52) U.S. Cl.
  CPC ......... *G01R 33/0094* (2013.01); *B60W 40/06* (2013.01)
(58) Field of Classification Search
  CPC .................................................. G01R 33/0094
  See application file for complete search history.

(56) References Cited

U.S. PATENT DOCUMENTS

2013/0069821 A1 3/2013 Jambulingam et al.
2019/0299724 A1* 10/2019 Liu ..................... B60C 23/0422

FOREIGN PATENT DOCUMENTS

| CN | 100549721 C | 10/2009 |
| CN | 101504289 B | 10/2011 |
| DE | 102013201014 A1 | 8/2013 |

* cited by examiner

*Primary Examiner* — Alesa Allgood
(74) *Attorney, Agent, or Firm* — Michael Best & Friedrich LLP

(57) ABSTRACT

A method for determining a road type includes measuring, for a preset period, a magnetic field of an environment in which an electronic device is located to obtain a plurality of magnetic field values, calculating an absolute value of a difference between every two adjacent magnetic field values among the magnetic field values sorted in chronological order, calculating an average of the absolute values related to the magnetic field values to serve as a variation value for the environment, determining whether the variation value is smaller than a predetermined threshold value, determining that the environment is a surface road when the determination result is affirmative, and determining that the environment is a non-surface road when the determination result is negative.

7 Claims, 4 Drawing Sheets

METHOD AND ELECTRONIC DEVICE FOR DETERMINING ROAD TYPE

CROSS-REFERENCE TO RELATED APPLICATION

This application claims priority to Taiwanese Invention Patent Application No. 111138294, filed on Oct. 7, 2022.

FIELD

The disclosure relates to a method for determining a road type, and more particularly to a method for determining a road type through magnetic field detection.

BACKGROUND

Conventionally, in a scenario where the global positioning system (GPS) is used to aid in navigation, when a user is located in an environment having multi-level roads, such as a combination of a surface road and an elevated road, or a combination of a surface road and an underground road, a GPS device is required to determine which level of road the user is currently on so as to provide suitable navigation information and traffic information to the user. However, an altitude measured using the GPS system may not be accurate enough to correctly determine the level of the road. One approach is to utilize a barometer integrated in a GPS device to measure an altitude of the GPS device so as to determine whether the GPS device and its user are located on a surface road, an elevated road or an underground road.

SUMMARY

Roads having structures built using metal materials may produce distinct magnetic fields depending on different road types. Therefore, an object of the disclosure is to provide a method and an electronic device that are adapted for determining a road type by analyzing its magnetic fingerprint and that can alleviate at least one of the drawbacks of the prior art.

According to the disclosure, the method for determining a road type is to be performed by an electronic device, and includes measuring, for a preset period, a magnetic field of an environment in which the electronic device is located to obtain a plurality of magnetic field values based on a result of the measurement, calculating an absolute value of a difference between every two adjacent magnetic field values among the magnetic field values sorted in chronological order, calculating an average of the absolute values related to the magnetic field values, making the average serve as a variation value for the environment, determining whether the variation value is smaller than a predetermined threshold value, when it is determined that the variation value is smaller than the predetermined threshold value, determining that the environment is a surface road, and when it is determined that the variation value is not smaller than the predetermined threshold value, determining that the environment is a non-surface road.

According to the disclosure, the electronic device for determining a road type includes a magnetic field sensor, and a processor electrically connected to the magnetic field sensor. The processor configured to control the magnetic field sensor to measure, for a preset period, a magnetic field of an environment in which the electronic device is located, to receive, from the magnetic field sensor, a plurality of magnetic field values that are obtained by the magnetic field sensor based on a result of the measurement, to calculate an absolute value of a difference between every two adjacent magnetic field values among the magnetic field values sorted in chronological order, to calculate an average of the absolute values related to the magnetic field values, to make the average serve as a variation value for the environment, to determine whether the variation value is smaller than a predetermined threshold value, when it is determined that the variation value is smaller than the predetermined threshold value, to determine that the environment is a surface road, and when it is determined that the variation value is not smaller than the predetermined threshold value, to determine that the environment is a non-surface road.

According to the disclosure, a non-transitory machine readable storage medium stores instructions that, when executed by a processor of an electronic device, cause the processor to perform steps of the method as mentioned above.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
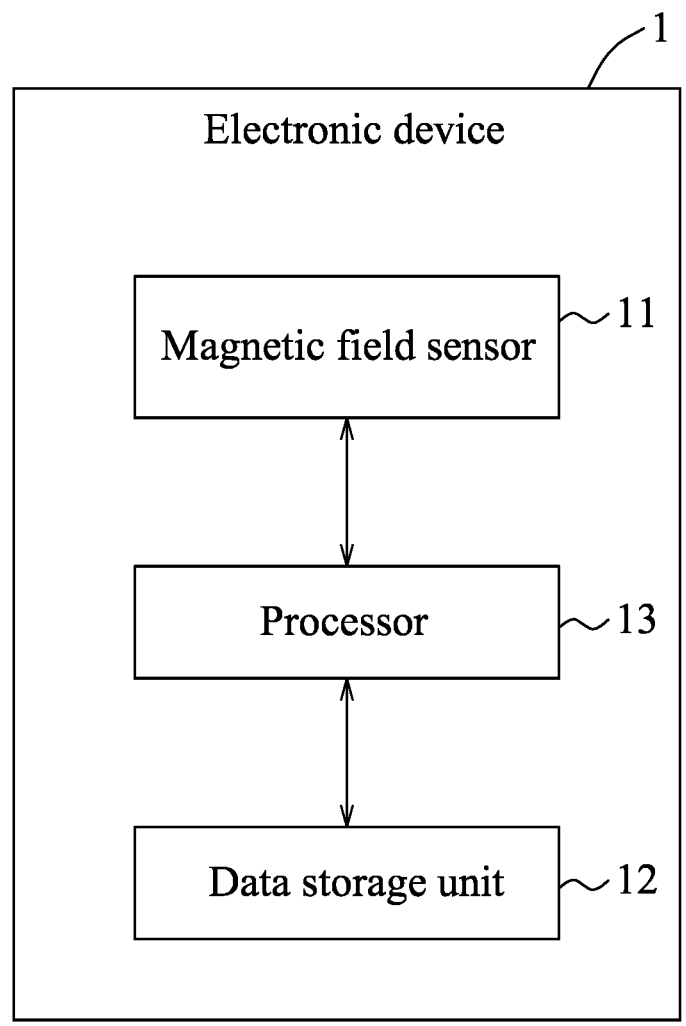
FIG. 1 is block diagram illustrating an embodiment of an electronic device for determining a road type according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an electronic device for determining a road type (referred to as an electronic device 1 hereinafter) according to an embodiment of the disclosure is illustrated. The electronic device 1 includes a magnetic field sensor 11, a data storage unit 12, and a processor 13 to which the magnetic field sensor 11 and the data storage unit 12 are electrically connected. In some embodiments, the magnetic field sensor 11 is implemented by a magnetometer or a microelectromechanical systems (MEMS) magnetic field sensor; the data storage unit 12 is implemented by flash memory, a hard disk drive (HDD), a solid state disk (SSD), an electrically-erasable programmable read-only memory (EEPROM) or any other non-volatile memory devices; and the processor 13 is implemented by a central processing unit (CPU), a microprocessor, a mobile processor, a micro control unit (MCU), a digital signal processor (DSP), a field-programmable gate array (FPGA), or any circuit configurable/programmable in a software manner and/or hardware manner to implement functionalities of this disclosure. In some embodiments, the electronic device 1 may be embodied by a smartphone that includes electronic components, such as a mobile processor and flash memory and that is built-in with a magnetometer, a barometer and an accelerometer. It is noted that implementations of the magnetic field sensor 11, the data storage unit 12 and the processor 13 are not limited to the disclosure herein and may vary in other embodiments.

Figure 2:
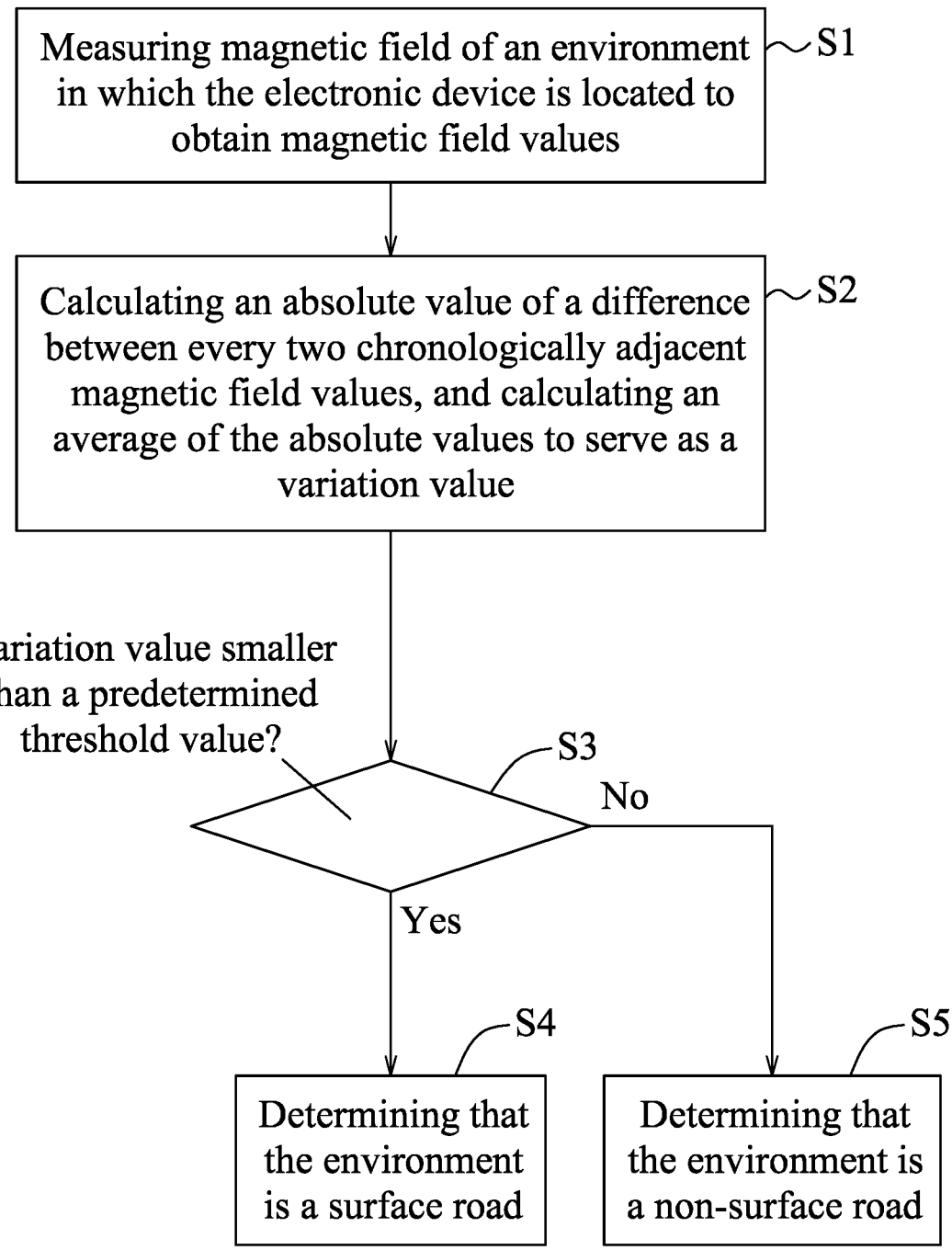
FIG. 2 is flow chart illustrating an embodiment of a method for determining a road type according to the disclosure.

Referring to FIG. 2, a method for determining a road type according to an embodiment of the disclosure is illustrated, and is adapted to be performed by the electronic device 1 exemplarily illustrated in FIG. 1. In some embodiments, the processor 13 is configured to read software instructions that are integrated into a software program from a computer-readable storage medium (such as, but not limited to the data storage unit 12), so as to execute the software program to perform the method for determining a road type of this disclosure.

After a command to determine a road type is received by the processor 13 and after the software program is executed, the method begins at step S1, where the processor 13 controls the magnetic field sensor 11 to measure, for a preset period, a magnetic field in an environment in which the electronic device 1 is located. The magnetic field sensor 11 obtains a plurality of magnetic field values based on a result of the measurement, and the processor 13 receives the magnetic field values from the magnetic field sensor 11. In some embodiments, the magnetic field sensor 11 may continuously measure the magnetic field at a rate of about 100 times per second, the preset period may be about two seconds, the magnetic field sensor 11 obtains two hundred (200) magnetic field values, and the environment may be a road.

In step S2, the processor 13 calculates an absolute value of a difference between every two adjacent magnetic field values among the magnetic field values received from the magnetic field sensor 11 and sorted in chronological order. In the example where 200 magnetic field values are received from the magnetic field sensor 11, the processor 13 would calculate 199 absolute values. Subsequently, the processor 13 calculates an average of the absolute values related to the magnetic field values, and makes the average serve as a variation value for the environment in which the electronic device 1 is located. In the above example, the processor 13 would calculate a sum of the 199 absolute values and divide the sum by 199 to obtain the average.

Based on experimentation, a variation value for a surface road is significantly smaller than a variation value for a non-surface road. In this way, a predetermined threshold value that can be used to distinguish between a surface road and a non-surface road is determined in advance based on results of experiments and is provided to the processor 13. In step S3, the processor 13 determines whether the variation value obtained in step S2 is smaller than the predetermined threshold value. When it is determined by the processor 13 that the variation value is smaller than the predetermined threshold value, a flow of the method proceeds to step S4, where the processor 13 determines that the environment in which the electronic device 1 is located is a surface road. Otherwise, when it is determined by the processor 13 that the variation value is not smaller than the predetermined threshold value, the flow proceeds to step S5, where the processor 13 determines that the environment in which the electronic device 1 is located is a non-surface road.

Figure 4:
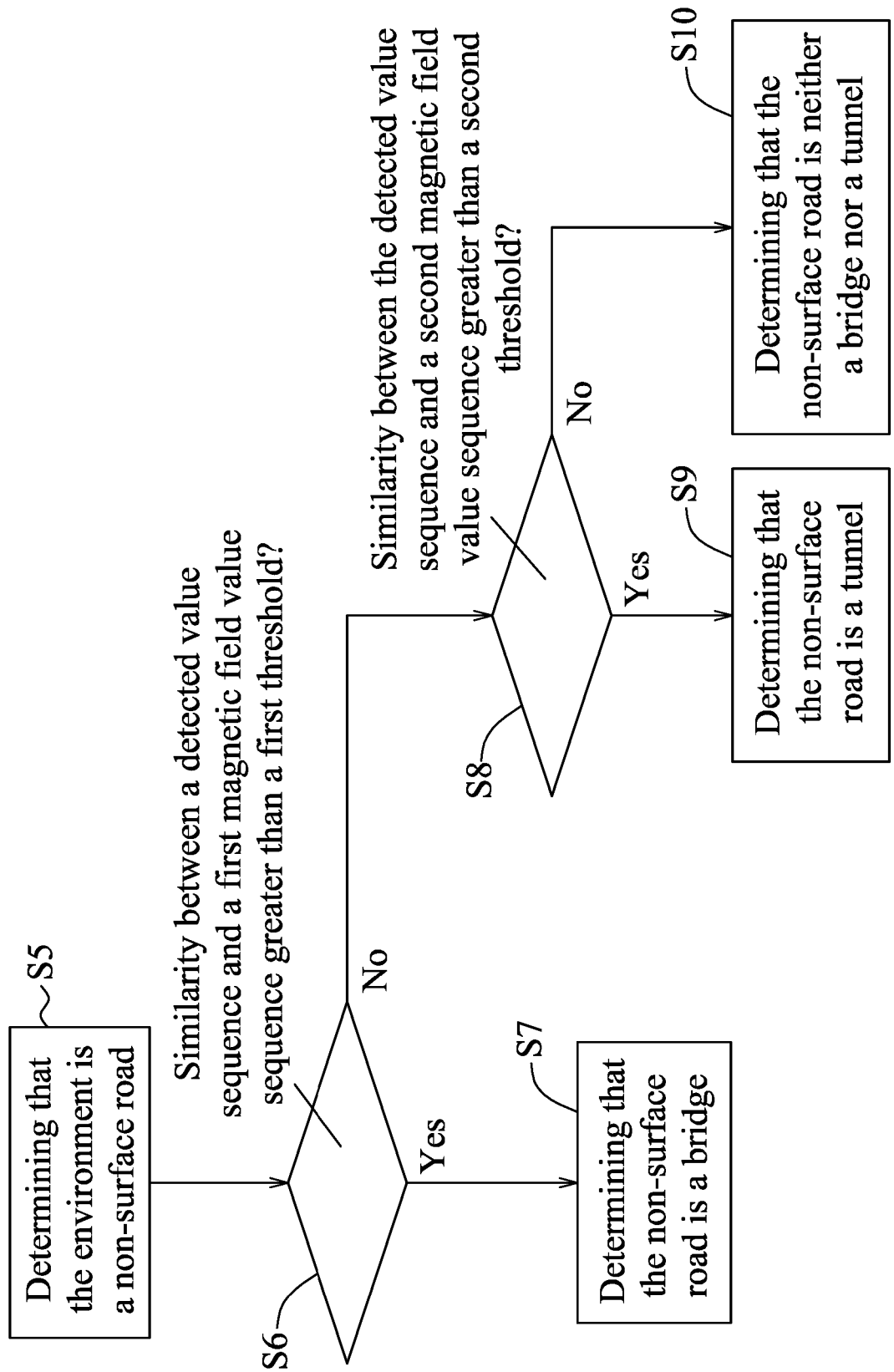
FIG. 4 is a flow chart illustrating an embodiment of additional steps of the method for determining a road type according to the disclosure.

Referring to FIG. 4, in some embodiments, after the processor 13 determines that the environment in which the electronic device 1 is located is a non-surface road, the processor 13 further determines whether the non-surface road is a bridge or a tunnel.

Figure 3:
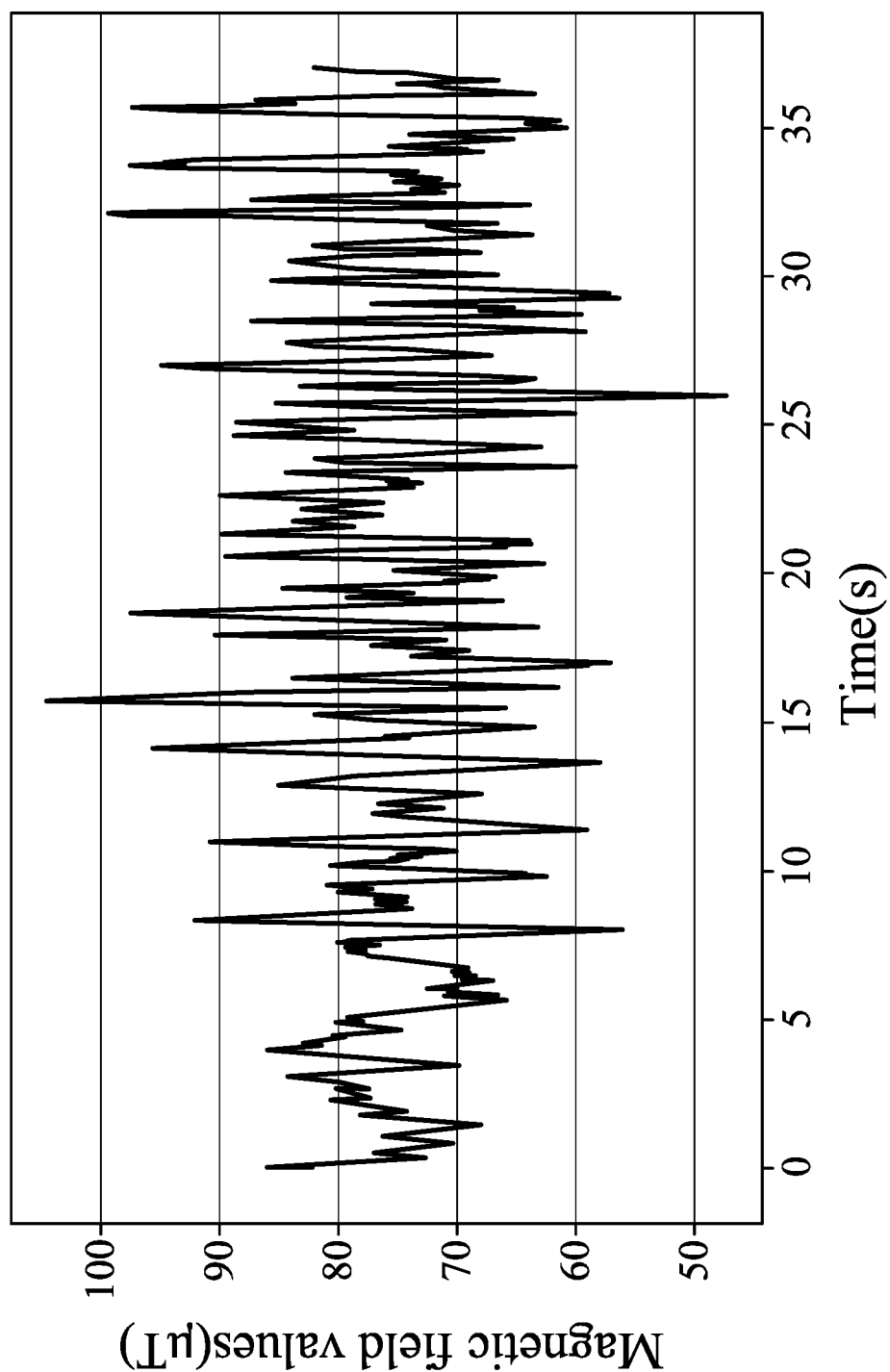
FIG. 3 is a schematic diagram illustrating an embodiment of a magnetic field sequence according to the disclosure.

To achieve this, the data storage unit 12 further stores a first magnetic field value sequence that represents a bridge, and a second magnetic field value sequence that represents a tunnel. It is noted that a magnetic field value sequence is known as a magnetic fingerprint and is exemplarily illustrated in FIG. 3. Moreover, after determining that the environment is a non-surface road in step S5, the processor 13 arranges the magnetic field values in chronological order to form a detected value sequence, and reads the first and second magnetic field value sequences from the data storage unit 12. Referring to FIG. 4, the flow then proceeds to step S6, where the processor 13 determines whether a similarity between the detected value sequence and the first magnetic field value sequence is greater than a first threshold. When it is determined that the similarity between the detected value sequence and the first magnetic field value sequence is greater than the first threshold, the flow proceeds to step S7, where the processor 13 determines that the non-surface road is a bridge. Otherwise, when it is determined that the similarity between the detected value sequence and the first magnetic field value sequence is not greater than the first threshold, the flow proceeds to step S8.

In step S8, the processor 13 determines whether a similarity between the detected value sequence and the second magnetic field value sequence is greater than a second threshold. When it is determined that the similarity between the detected value sequence and the second magnetic field value sequence is greater than the second threshold, the flow proceeds to step S9, where the processor 13 determines that the non-surface road is a tunnel. Otherwise, when it is determined that the similarity between the detected value sequence and the second magnetic field value sequence is not greater than the second threshold, the flow proceeds to step S10, where the processor 13 determines that the non-surface road is another type of road other than a bridge or a tunnel (i.e., the non-surface road belongs to neither a bridge nor a tunnel).

In some embodiments, the processor 13 determines the similarity between the detected value sequence and the first or second magnetic field value sequence by comparing patterns of waveforms between the detected value sequence and the first/second magnetic field value sequence. In some embodiments, determining the similarity may be implemented using a similarity function, such as cosine similarity or the inverse of a distance function. In some embodiments, if a length of one of the first and second magnetic field value sequences is greater than that of the detected value sequence, the processor 13 first extracts a segment (e.g., an initial segment) of said one of the first and second magnetic field value sequences such that the segment has a length identical to that of the detected value sequence, and then determines a similarity between the segment and the detected value sequence. In some embodiments, the first and second thresholds are set in advance and are both 80%. However, the values of the first and second thresholds are not limited to the disclosure herein, and may be other values depending on actual requirements.

It is note that an order of performing steps S6 and S8 is not limited to the description mentioned above, and can be so changed that step S8 is performed prior to step S6, that is, the processor 13 first determines whether a similarity between the detected value sequence and the second magnetic field value sequence is greater than the second threshold, and when in the negative, the processor 13 then determines whether a similarity between the detected value sequence and the first magnetic field value sequence is greater than the first threshold.

In this way, in a scenario where the electronic device 1 is installed with a positioning system, such as the Global Positioning System (GPS), when the positioning system determines that the electronic device 1 is approaching an environment having multi-level roads, such as a combination of a surface road and an elevated road, or a combination of a surface road and an underground road, the positioning system transmits the command to determine a road type to the processor 13. In response to receipt of the command, the processor 13 is configured to perform the aforementioned steps of the method for determining a road type as shown in FIG. 2, so as to obtain a determination result as to whether a road which the electronic device 1 is currently on is a surface road or a non-surface road. The processor 13 is further configured to provide the determination result to the positioning system to assist the positioning system in obtaining road information and traffic information based on the determination result. In this way, the correct road information and traffic information corresponding to the road which a user is currently on can be provided (e.g., displayed on a display) to the user.

Further, if the positioning system needs to know whether the non-surface road is a bridge or a tunnel, the processor 13 is able to perform the steps of the method shown in FIG. 4 so as to determine whether the non-surface road is a bridge or a tunnel, and then provide such determination result to the positioning system.

To sum up, by obtaining a plurality of consecutive magnetic field values related to an environment in which the electronic device is located, by calculating a variation value for the environment based on the magnetic field values, and by determining whether the variation value is smaller than a threshold value, the method and electronic device for determining a road type according to this disclosure are able to determine whether the environment is a surface road or a non-surface road. Moreover, by comparing a similarity between the detected value sequence that is formed by arranging the magnetic field values in chronological order and magnetic field value sequences relating respectively to a bridge and a tunnel, the method and electronic device for determining a road type according to this disclosure are able to further determine whether the non-surface road is a bridge, a tunnel, or neither.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for determining a road type, the method to be performed by an electronic device which is installed with a positioning system, the electronic device including a magnetic field sensor that is implemented by one of a magnetometer and a microelectromechanical systems (MEMS) magnetic field sensor, the method comprising:
   transmitting, when the positioning system determines that the electronic device is approaching an environment having multi-level roads where the positioning system is prone to falsely determining a level of a road, a command to activate a function of determining the road type;
   measuring, by using the magnetic field sensor for a preset period, a magnetic field of the environment in which the electronic device is located to obtain a plurality of magnetic field values based on a result of the measurement;
   calculating an absolute value of a difference between every two adjacent magnetic field values among the magnetic field values sorted in chronological order;
   calculating an average of the absolute values related to the magnetic field values, and making the average serve as a variation value for the environment;
   determining whether the variation value is smaller than a predetermined threshold value;
   when it is determined that the variation value is smaller than the predetermined threshold value, determining that the environment is a surface road;
   when it is determined that the variation value is not smaller than the predetermined threshold value, determining that the environment is a non-surface road;
   the positioning system obtaining road information and traffic information based on the determination that the environment is one of the surface road and the non-surface road; and
   the positioning system performing navigation by providing to a user the road information and the traffic information, which match the road the user is currently on so the user is able to correctly navigate through the environment having multi-level roads.

2. The method as claimed in claim 1, the electronic device storing a first magnetic field value sequence that represents a bridge, the method further comprising, subsequent to determining that the environment is a non-surface road,
   arranging the magnetic field values in chronological order to form a detected value sequence;
   determining whether a similarity between the detected value sequence and the first magnetic field value sequence is greater than a first threshold;
   when it is determined that the similarity between the detected value sequence and the first magnetic field value sequence is greater than the first threshold, determining that the non-surface road is a bridge.

3. The method as claimed in claim 1, the electronic device storing a second magnetic field value sequence that represents a tunnel, the method further comprising, subsequent to determining that the environment is a non-surface road,
  arranging the magnetic field values in chronological order to form a detected value sequence;
  determining whether a similarity between the detected value sequence and the second magnetic field value sequence is greater than a second threshold; and
  when it is determined that the similarity between the detected value sequence and the second magnetic field value sequence is greater than the second threshold, determining that the non-surface road is a tunnel.

4. An electronic device for determining a road type, comprising:
  a magnetic field sensor implemented by one of a magnetometer and a microelectromechanical systems (MEMS) magnetic field sensor;
  a positioning system installed in the electronic device and configured to, when the positioning system determines that the electronic device is approaching an environment having multi-level roads where the positioning system is prone to falsely determining a level of a road, transmit a command to activate a function of determining the road type; and
  a processor electrically connected to the magnetic field sensor, and configured to:
  in response to receipt of the command, control the magnetic field sensor to measure, for a preset period, a magnetic field of the environment in which the electronic device is located,
  receive, from the magnetic field sensor, a plurality of magnetic field values that are obtained by the magnetic field sensor based on a result of the measurement,
  calculate an absolute value of a difference between every two adjacent magnetic field values among the magnetic field values sorted in chronological order,
  calculate an average of the absolute values related to the magnetic field values, and make the average serve as a variation value for the environment,
  determine whether the variation value is smaller than a predetermined threshold value,
  when it is determined that the variation value is smaller than the predetermined threshold value, determine that the environment is a surface road,
  when it is determined that the variation value is not smaller than the predetermined threshold value, determine that the environment is a non-surface road,
  obtain road information and traffic information based on the determination that the environment is one of the surface road and the non-surface road, and
  perform navigation by providing to a user the road information and the traffic information, which match the road the user is currently on so the user is able to correctly navigate through the environment having multi-level roads.

5. The electronic device as claimed in claim 4, further comprising a data storage unit that stores a first magnetic field value sequence which represents a bridge, wherein the processor is further configured to:
  arrange the magnetic field values in chronological order to form a detected value sequence;
  determine whether a similarity between the detected value sequence and the first magnetic field value sequence is greater than a first threshold;
  when it is determined that the similarity between the detected value sequence and the first magnetic field value sequence is greater than the first threshold, determine that the non-surface road is a bridge.

6. The electronic device as claimed in claim 4, further comprising a data storage unit that stores a second magnetic field value sequence which represents a tunnel, wherein the processor is further configured to:
  arrange the magnetic field values in chronological order to form a detected value sequence;
  determine whether a similarity between the detected value sequence and the second magnetic field value sequence is greater than a second threshold; and
  when it is determined that the similarity between the detected value sequence and the second magnetic field value sequence is greater than the second threshold, determine that the non-surface road is a tunnel.

7. A non-transitory machine readable storage medium storing instructions that, when executed by a processor of an electronic device, cause the processor to perform steps of a method as claimed in claim 1.

* * * * *